(12) United States Patent
Yang et al.

(10) Patent No.: US 10,644,266 B2
(45) Date of Patent: *May 5, 2020

(54) ORGANIC LIGHT EMITTING DISPLAY APPARATUS

(71) Applicant: Samsung Display Co., Ltd., Yongin-si, Gyeonggi-do (KR)

(72) Inventors: Jungjin Yang, Seoul (KR); Wonjun Song, Hwaesong-si (KR); Kwanhee Lee, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/823,470

(22) Filed: Nov. 27, 2017

(65) Prior Publication Data

US 2018/0083228 A1 Mar. 22, 2018

Related U.S. Application Data

(63) Continuation of application No. 15/172,059, filed on Jun. 2, 2016, now Pat. No. 9,831,469.

(30) Foreign Application Priority Data

Sep. 1, 2015 (KR) .......................... 10-2015-0123793

(51) Int. Cl.
*H01L 51/52* (2006.01)
*G02B 5/02* (2006.01)
*H01L 27/32* (2006.01)

(52) U.S. Cl.
CPC ............ *H01L 51/5268* (2013.01); *G02B 5/02* (2013.01); *G02B 5/0242* (2013.01);
(Continued)

(58) Field of Classification Search
CPC ............... H01L 51/5268; H01L 51/524; H01L 51/5253; H01L 51/5281; H01L 27/3246;
(Continued)

(56) References Cited

U.S. PATENT DOCUMENTS 7,462,857 B2 12/2008 Arai et al.
9,831,469 B2 * 11/2017 Yang .................... H01L 51/5268
(Continued)

FOREIGN PATENT DOCUMENTS

CN 103137649 A 6/2013
CN 104466010 A 3/2015
(Continued)

*Primary Examiner* — Farun Lu
(74) *Attorney, Agent, or Firm* — Lewis Roca Rothgerber Christie LLP

(57) ABSTRACT

An organic light emitting display apparatus includes a substrate, a plurality of organic light emitting elements on the substrate, an encapsulation substrate covering the organic light emitting elements, and a scattering layer including a resin, and a plurality of scattering particles distributed in the resin, and including a variety of particle sizes in a first range from about 500 nm to about 800 nm, wherein ones of the scattering particles having a first particle size include a highest concentration of the scattering particles, and wherein a concentration of other ones of the scattering particles is inversely proportional to a magnitude of a difference in particle size between the other ones of the scattering particles and the ones of the scattering particles having the first particle size.

18 Claims, 13 Drawing Sheets

(52) U.S. Cl.
CPC ........ *H01L 51/524* (2013.01); *H01L 51/5253* (2013.01); *H01L 51/5281* (2013.01); *H01L 27/3246* (2013.01); *H01L 27/3248* (2013.01); *H01L 27/3258* (2013.01); *H01L 2251/301* (2013.01); *H01L 2251/303* (2013.01); *H01L 2251/5315* (2013.01); *H01L 2251/5369* (2013.01); *H01L 2251/558* (2013.01)

(58) Field of Classification Search
CPC ............. H01L 27/3248; H01L 27/3258; H01L 2251/301; H01L 2251/303; H01L 2251/5315; H01L 2251/5369; H01L 2251/558; H01L 2924/181; H01L 2933/0091; H01L 2924/12041; H01L 33/50; H01L 33/58; G02B 5/02
See application file for complete search history.

(56) References Cited

U.S. PATENT DOCUMENTS

| | | |
|---|---|---|
| 2007/0114523 A1 | 5/2007 | Oumi et al. |
| 2010/0225229 A1 | 9/2010 | Hosoda et al. |
| 2013/0140982 A1 | 6/2013 | Park |
| 2013/0328479 A1* | 12/2013 | Jung .................... G02B 5/0278 313/504 |
| 2015/0084005 A1 | 3/2015 | Sista et al. |
| 2016/0079479 A1* | 3/2016 | Yamana ............. H01L 51/5268 257/98 |
| 2016/0190517 A1* | 6/2016 | Masuda ............. H01L 51/5259 257/40 |
| 2016/0329515 A1* | 11/2016 | Fleissner ............ H01L 51/5265 |

FOREIGN PATENT DOCUMENTS

| | | |
|---|---|---|
| JP | 2010-256431 A | 11/2010 |
| JP | 2015-022795 A | 2/2015 |
| KR | 10-2007-0085321 A | 8/2007 |
| KR | 10-2010-0138956 A | 12/2010 |
| KR | 2011-0108697 A | 10/2011 |
| KR | 10-1147421 B1 | 5/2012 |
| KR | 2014-0105175 A | 9/2014 |
| WO | WO 2004/027877 A1 | 4/2004 |

* cited by examiner

ORGANIC LIGHT EMITTING DISPLAY APPARATUS

CROSS-REFERENCE TO RELATED APPLICATION

This application is a continuation of U.S. patent application Ser. No. 15/172,059, filed Jun. 2, 2016, which claims priority to and the benefit of Korean Patent Application No. 10-2015-0123793, filed Sep. 1, 2015, the entire content of both of which is incorporated herein by reference.

BACKGROUND

1. Field

Embodiments of the present disclosure relate to an organic light emitting display apparatus capable of reducing a color difference caused by a variation in viewing angle.

2. Description of the Related Art

In general, an organic light emitting display apparatus includes an organic light emitting device including an anode electrode, an organic light emitting layer, and a cathode electrode. In the organic light emitting device, holes and electrons are respectively injected into the organic light emitting layer through the anode electrode and the cathode electrode, and are then recombined in the organic light emitting layer to generate an exciton. The exciton emits energy that is discharged as light when an excited state returns to a ground state.

The organic light emitting display apparatus has a self-emissive characteristic, and does not need to include a separate light source, unlike a liquid crystal display, and thus overall thickness and weight of the organic light emitting display apparatus are reduced. In addition, the organic light emitting display apparatus has been spotlighted as a next generation display apparatus for its superior properties (e.g., low power consumption, high brightness, fast response speed, etc.).

However, a resonance distance of a light emitted from the organic light emitting layer may be changed according to a viewing angle, and as a result, a color shift phenomenon, in which colors seem to be shifted, may occur.

SUMMARY

The present disclosure provides an organic light emitting display apparatus capable of reducing a color difference caused by a variation in viewing angle.

Embodiments of the inventive concept provide an organic light emitting display apparatus including a substrate, a plurality of organic light emitting elements on the substrate, an encapsulation substrate covering the organic light emitting elements, and a scattering layer including a resin, and a plurality of scattering particles distributed in the resin, and including a variety of particle sizes in a first range from about 500 nm to about 800 nm, wherein ones of the scattering particles having a first particle size include a highest concentration of the scattering particles, and wherein a concentration of other ones of the scattering particles is inversely proportional to a magnitude of a difference in particle size between the other ones of the scattering particles and the ones of the scattering particles having the first particle size.

Concentrations of respective groups of similarly sized ones of the scattering particles may satisfy a normal distribution.

The organic light emitting display apparatus may further include a polarizing film on the scattering layer.

The scattering layer may face the substrate such that the encapsulation substrate is between the scattering layer and the substrate.

The scattering layer may face the encapsulation substrate such that the substrate is between the scattering layer and the encapsulation substrate.

The resin may include a transparent adhesive material, and the scattering layer may be attached to the polarization film.

The scattering layer may include a thickness of about 50 micrometers or less.

The concentration of the scattering particles with respect to the scattering layer may be about 50% or less.

The scattering particles may include at least one of $Al_2O_3$ or Zr.

The scattering particles may include $SiO_2$.

The first particle size may be about 650 nm, and a full-width half-maximum corresponding to a graph of concentration percentages of the scattering particles grouped by particle size as a function of the particle size may be in a range from about 145 nm to about 155 nm.

The scattering particles may have a variety of particle sizes in a second range from about 560 nm to about 740 nm, the first particle size may be about 650 nm, and a full-width half-maximum corresponding to a graph of concentration percentages of the scattering particles grouped by particle size as a function of the particle size may be in a range from about 70 nm to about 80 nm.

The scattering particles may have a variety of particle sizes in a third range from about 605 nm to about 695 nm, the first particle size may be about 650 nm, and a full-width half-maximum corresponding to a graph of concentration percentages of the scattering particles grouped by particle size as a function of the particle size may be in a range from about 25 nm to about 35 nm.

The scattering particles may have a variety of particle sizes in a fourth range from about 515 nm to about 665 nm, the first particle size may be about 590 nm, and a full-width half-maximum corresponding to a graph of concentration percentages of the scattering particles grouped by particle size as a function of the particle size may be in a range from about 45 nm to about 55 nm.

Embodiments of the inventive concept provide an organic light emitting display apparatus including a substrate, a plurality of organic light emitting elements on the substrate, an encapsulation substrate covering the organic light emitting elements, and a scattering layer having a thickness of about 50 micrometers or less, and including a resin, and a plurality of scattering particles distributed in the resin, wherein the scattering particles have a variety of particle sizes ranging from about 500 nm to about 800 nm, wherein concentrations of respective ones of the scattering particles grouped according to a particle size satisfy a normal distribution, and wherein a concentration of the scattering particles with respect to the scattering layer is about 50% or less.

According to the above, the color difference caused by the variation in viewing angle may be prevented from occurring.

BRIEF DESCRIPTION OF THE DRAWINGS

The above and other aspects of the present disclosure will become readily apparent by reference to the following detailed description when considered in conjunction with the accompanying drawings, wherein.

DETAILED DESCRIPTION

Figure 1:
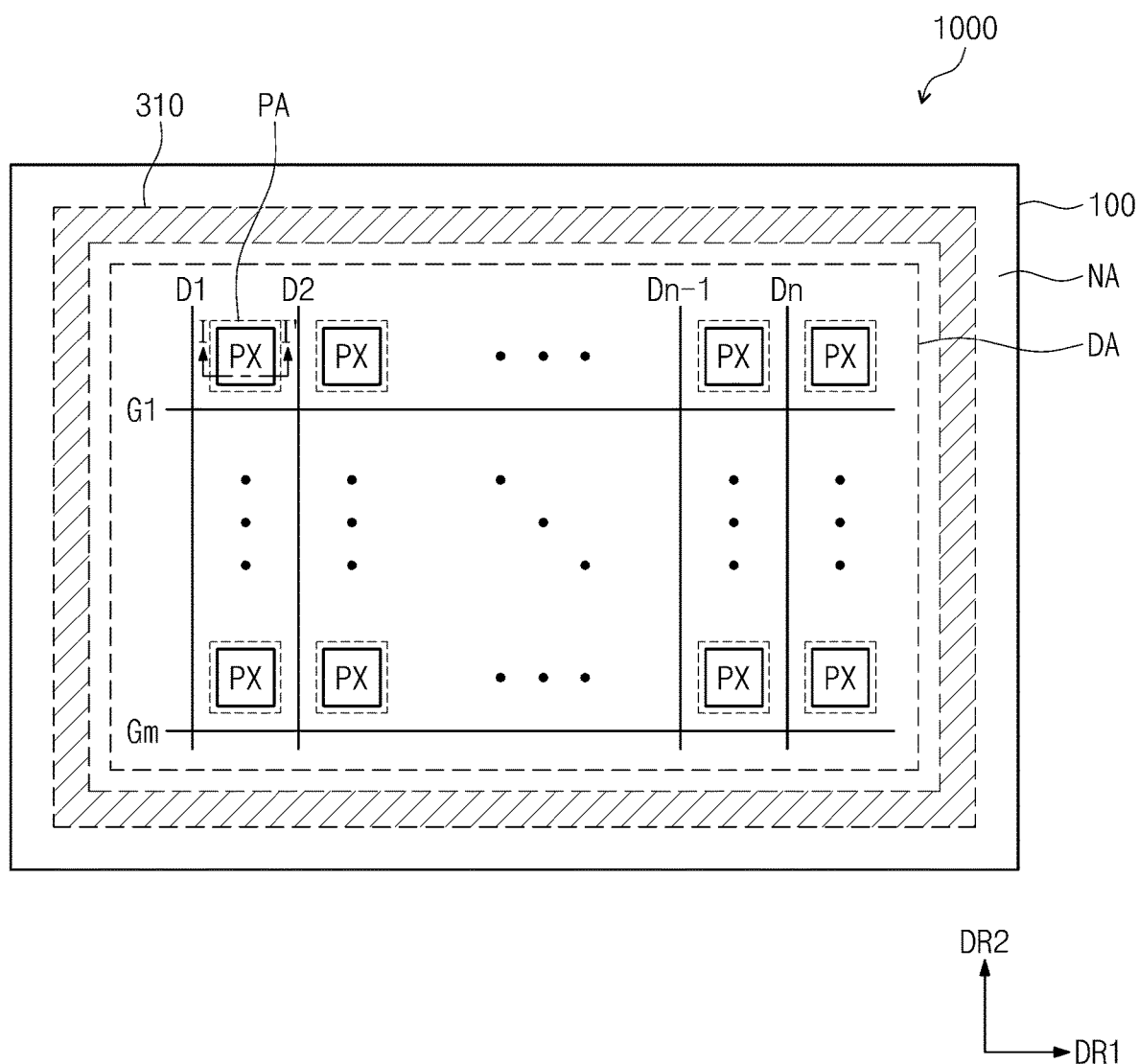
FIG. 1 is a plan view showing an organic light emitting display apparatus according to an exemplary embodiment of the present disclosure.

Features of the inventive concept and methods of accomplishing the same may be understood more readily by reference to the following detailed description of embodiments and the accompanying drawings. The inventive concept may, however, be embodied in many different forms and should not be construed as being limited to the embodiments set forth herein. Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. In addition, it will also be understood that when an element or layer is referred to as being "between" two elements or layers, it can be the only element or layer between the two elements or layers, or one or more intervening elements or layers may also be present.

In the following examples, the x-axis, the y-axis and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another.

The terminology used herein is for the purpose of describing particular embodiments only and is not intended to be limiting of the present invention. As used herein, the singular forms "a," "an," and "the" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
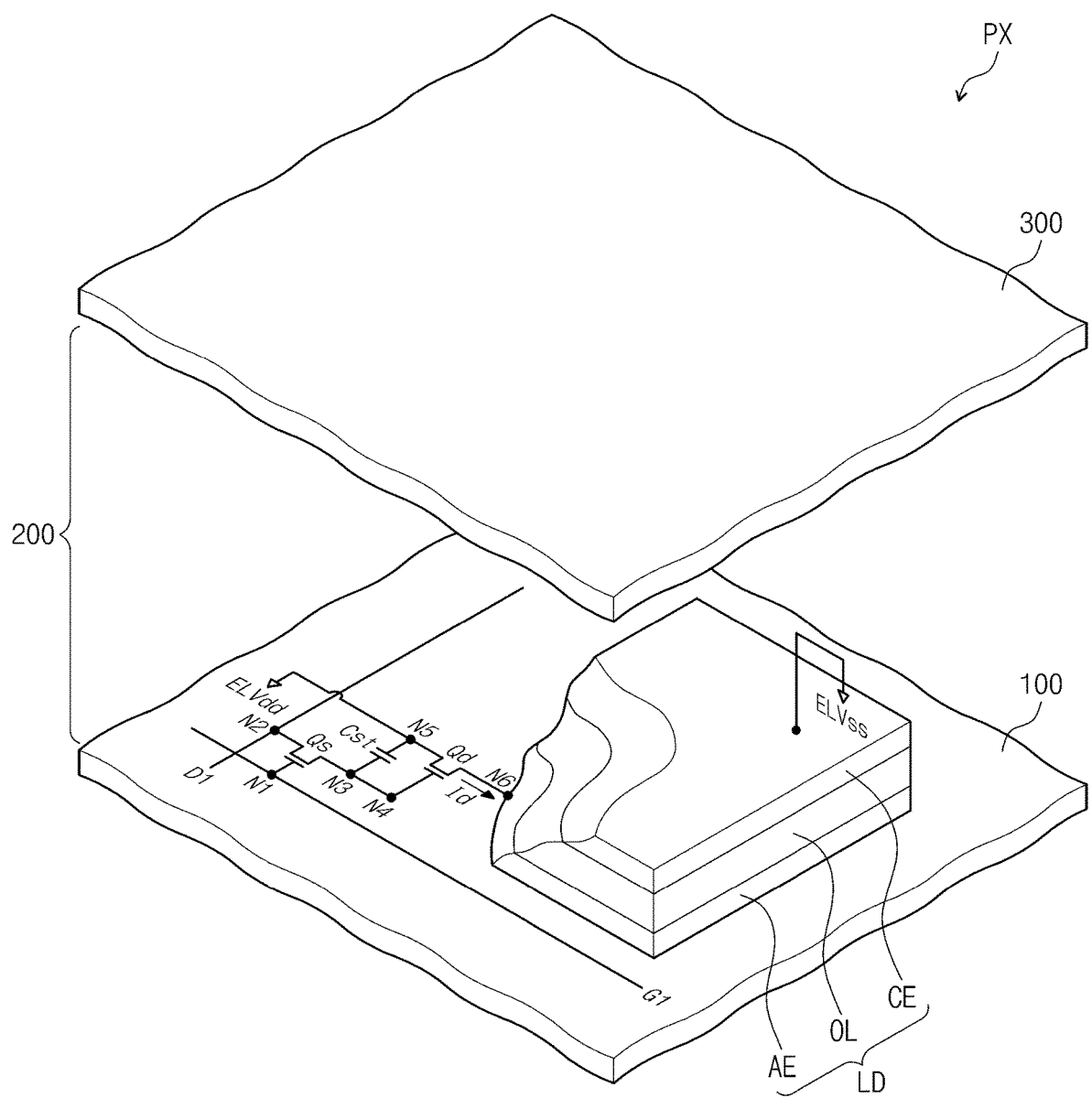
FIG. 2 is a view showing one pixel shown in FIG. 1.

FIG. 1 is a plan view showing an organic light emitting display apparatus 1000 according to an exemplary embodiment of the present disclosure, and FIG. 2 is a view showing one pixel shown in FIG. 1.

Referring to FIG. 1, the organic light emitting display apparatus 1000 includes a substrate (e.g., a base substrate) 100, a pixel layer 200 (see FIG. 2), an encapsulation substrate 300, and a scattering layer.

The substrate 100 includes a display area DA in which an image is displayed, and includes a non-display area NA adjacent the display area DA in which the image is not displayed. The display area DA includes a plurality of pixel areas PA therein.

The substrate 100 may be, but is not limited to, a flexible substrate, and may include a plastic material having superior heat resistance and durability (e.g., polyethylene etherphthalate, polyethylene naphthalate, polycarbonate, polyarylate, polyetherimide, polyethersulfone, polyimide, etc.), although the present invention is not limited thereto or thereby. That is, the substrate 100 of other embodiments may include a metal or glass material.

A barrier layer may be between the substrate 100 and the pixel layer 200 to prevent a foreign substance, such as moisture or oxygen, from entering into an organic light emitting element LD through the substrate 100.

The pixel layer 200 is between the substrate 100 and the encapsulation substrate 300. The pixel layer 200 includes a plurality of gate lines G1 to Gm, a plurality of data lines D1 to Dn, and a plurality of pixels PX. The gate lines G1 to Gm are insulated from the data lines D1 to Dn while crossing the data lines D1 to Dn. As shown in FIG. 1, the gate lines G1 to Gm extend in a first direction DR1, and the data lines D1 to Dn extend in a second direction DR2 that crosses the first direction DR1, although the present invention is not limited thereto or thereby. Each of the gate lines G1 to Gm and the data lines D1 to Dn may have a curved line shape, instead of a straight line shape, as long as the gate lines G1 to Gm cross the data lines D1 to Dn. The pixel areas PA are respectively defined by the gate lines G1 to Gm and the data lines D1 to Dn.

Each of the pixels PX is in a corresponding pixel area of the pixel areas PA. To display the image, each of the pixels PX is connected to a corresponding gate line of the gate lines G1 to Gm, and is also connected to a corresponding data line of the data lines D1 to Dn. Each of the pixels PX displays one of red, green, and blue colors, although the present invention is not limited thereto or thereby. That is, each of the pixels PX may display another color (e.g., a white color) rather than the red, green, and blue colors. In FIG. 1, each of the pixels PX has a substantially quadrangular shape, but the shape of the pixel should not be limited to the quadrangular shape. That is, each of the pixels PX may have various shapes (e.g., a polygonal shape, a circular shape, an oval shape, etc.).

FIG. 2 shows one pixel PX connected to a first gate line G1 and to a first data line D1 as a representative example.

Referring to FIG. 2, the pixel PX includes a switching transistor Qs, a driving transistor Qd, a storage capacitor Cst, and the organic light emitting element LD.

The switching transistor Qs includes a control terminal N1, an input terminal N2, and an output terminal N3. The control terminal N1 is connected to the first gate line G1, the input terminal N2 is connected to the first data line D1, and the output terminal N3 is connected to the driving transistor Qd. The switching transistor Qs applies a data voltage applied to the first data line D1 to the driving transistor Qd in response to a gate signal applied to the first gate line G1.

The driving transistor Qd includes a control terminal N4, an input terminal N5, and an output terminal N6. The control terminal N4 is connected to the output terminal N3 of the switching transistor Qs, the input terminal N5 receives a driving voltage ELVdd, and the output terminal N6 is connected to the organic light emitting element LD. The driving transistor Qd applies an output current Id having a level corresponding to a voltage level applied between the control terminal N4 and the output terminal N6.

The storage capacitor Cst is connected between the output terminal N3 of the switching transistor Qs and the input terminal N5 of the driving transistor Qd. The storage capacitor Cst is charged with the data voltage applied to the control terminal N4 of the driving transistor Qd, and maintains the charged voltage therein (e.g., for a predetermined time) after the switching transistor Qs is turned off.

The pixel layer 200 may further include a driving voltage line. The driving voltage line extends substantially parallel to the first gate line G1 or the first data line D1. The driving voltage line receives the driving voltage ELVdd, and is connected to the input terminal N5 of the driving transistor Qd.

The organic light emitting element LD includes a first electrode AE, an organic layer OL, and a second electrode CE.

The first electrode AE may be an anode electrode or a positive electrode. The first electrode AE is connected to the output terminal N6 of the driving transistor Qd to generate holes. The second electrode CE may be a cathode electrode or a negative electrode. The second electrode CE receives a common voltage ELVss and generates electrons. The organic layer OL is between the first electrode AE and the second electrode CE. The organic layer OL may include an organic material, and may include a plurality of layers.

The holes and the electrons are injected into an organic light emitting layer of the organic layer from the first and second electrodes AE and CE, respectively. The holes and the electrons are recombined in the organic light emitting layer to generate excitons. The excitons emit energy as light that is discharged when an excited state returns to a ground state. The light emitted from the organic light emitting layer has an intensity that is determined depending on the output current Id flowing through the output terminal N6 of the driving transistor Qd.

In the present exemplary embodiment, the organic layer OL may include two or more organic light emitting layers that emit lights that have different colors from each other.

In FIG. 2, the second electrode CE is above the first electrode AE, although positions of the first and second electrodes AE and CE may be changed with respect to each other.

The encapsulation substrate 300 is above the pixel layer 200. The encapsulation substrate 300 covers the display area DA. The encapsulation substrate 300 includes an organic layer and/or an inorganic layer, although the present invention is not limited thereto or thereby. For example, the encapsulation substrate 300 may be a glass substrate or a plastic substrate.

The organic light emitting display apparatus 1000 may further include a sealing member 310 (see FIG. 1). The sealing member 310 may surround the display area DA, and the substrate 100 is attached to the encapsulation substrate 300 by the sealing member 310. The sealing member 310 and the encapsulation substrate 300 prevent the organic light emitting element from being exposed to either moisture or air.

The scattering layer receives the light emitted from the organic light emitting element LD. The scattering layer is at a position determined by a direction in which the light of the organic light emitting display apparatus 100 travels. In detail, the position of the scattering layer in a front surface light emitting type organic light emitting display apparatus is different from the position of the scattering layer in a rear surface light emitting type organic light emitting display apparatus. The scattering layer scatters the light incident thereto.

Figure 3:
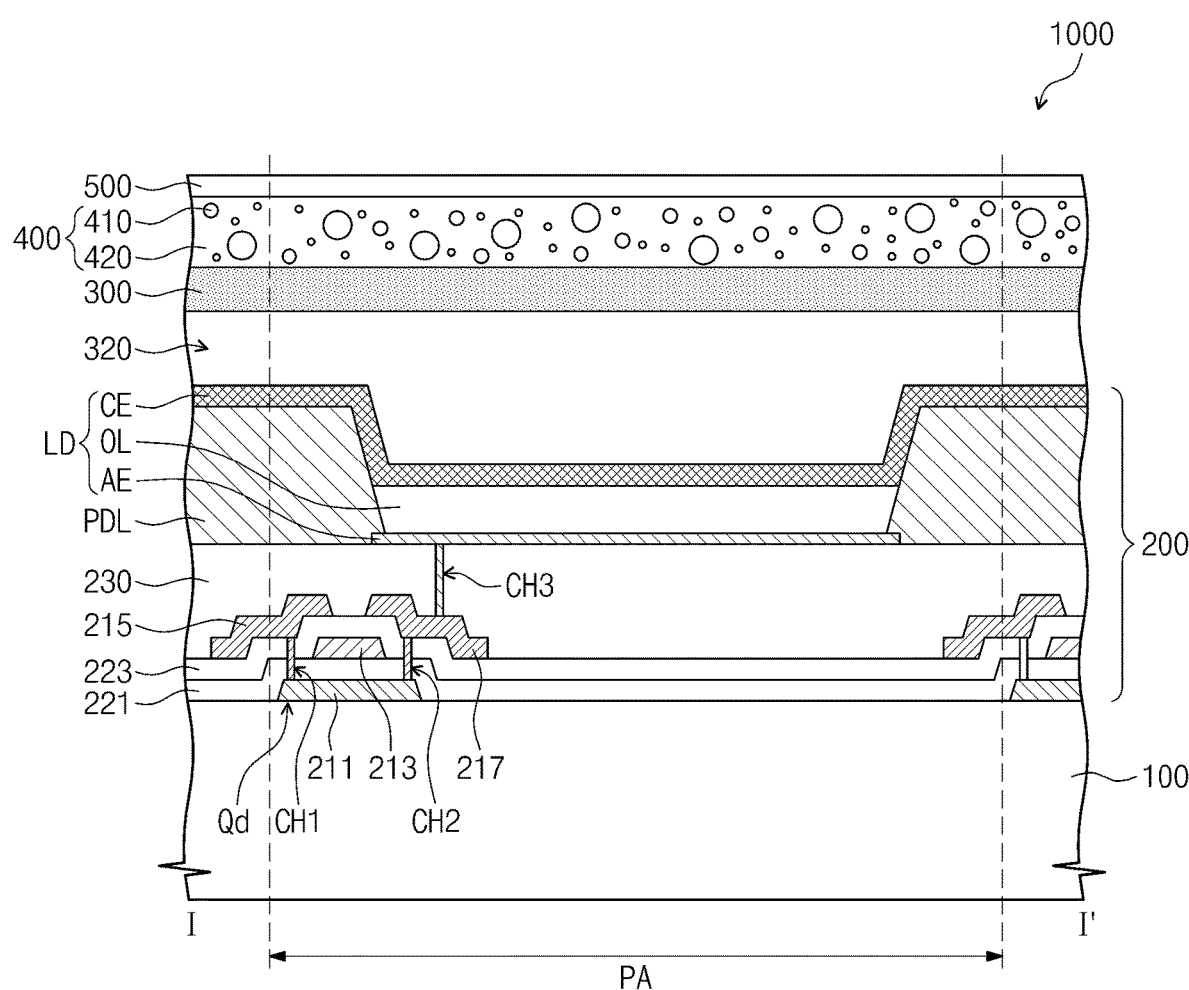
FIG. 3 is a cross-sectional view taken along the line I-I' of FIG. 1.
Figure 4:
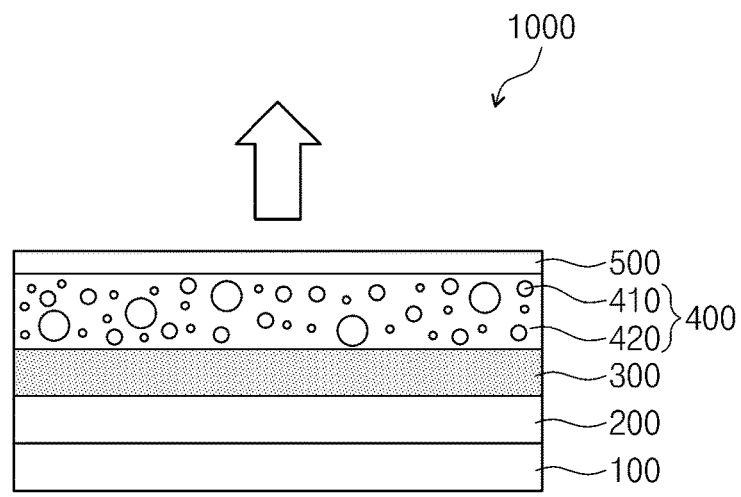
FIG. 4 is a cross-sectional view showing a structure of a front surface light emitting type organic light emitting display apparatus.

FIG. 3 is a cross-sectional view taken along the line I-I' of FIG. 1, and FIG. 4 is a cross-sectional view showing a structure of the front surface light emitting type organic light emitting display apparatus. FIG. 3 shows one pixel area of the organic light emitting display apparatus.

Referring to FIGS. 3 and 4, the driving transistor Qd includes an active layer 211, a gate electrode 213, a source electrode 215, and a drain electrode 217.

The active layer 211 is on the substrate 100. The pixel layer 200 may further include a first insulating layer 221 between the active layer 211 and the gate electrode 213. The first insulating layer 221 insulates the active layer 211 from the gate electrode 213. The source electrode 215 and the drain electrode 217 are above the gate electrode 213. The pixel layer 200 may further include a second insulating layer 223 between the gate electrode 213 and the source electrode 215, and between the gate electrode 213 and the drain electrode 217. Each of the source electrode 215 and the drain electrode 217 is connected to the active layer 211 through a corresponding one of contact holes CH1 and CH2 formed through the first and second insulating layers 221 and 223.

The structure of the driving transistor Qd should not be limited to that shown in FIG. 3, and positions of the active layer 211, the gate electrode 213, the source electrode 215, and the drain electrode 217 may be changed. For instance, different from the structure in which the gate electrode 212 is disposed above the active layer 211, the gate electrode 213 may instead be disposed under the active layer 211 according to other embodiments.

The pixel layer 200 may further include a protective layer 230 on the source electrode 215 and the drain electrode 217.

The first electrode AE is on the protective layer 230, and is connected to the drain electrode 217 through a contact hole CH3 formed through the protective layer 230.

The first electrode AE may be a pixel electrode or a positive electrode. The first electrode AE may be a transmissive electrode, a transflective electrode, or a reflective electrode. In the case where the first electrode AE is the transmissive electrode, the first electrode AE includes a transparent metal oxide (e.g., indium tin oxide (ITO), indium zinc oxide (IZO), zinc oxide (ZnO), indium tin zinc oxide (ITZO), etc.). When the first electrode AE is the transflective electrode or the reflective electrode, the first electrode AE includes Ag, Mg, Al, Pt, Pd, Au, Ni, Nd, Ir, Cr, and/or a mixture thereof.

The first electrode AE has a single-layer structure of the transparent metal oxide, or of metal, or has a multi-layer structure including a plurality of layers. For instance, the first electrode AE may have a single-layer structure of ITO, Ag, and/or a mixture of metal (e.g., a mixture of Ag and Mg), may have a double-layer structure of ITO/Mg or ITO/MgF, or may have a triple-layer structure of ITO/Ag/ITO, although the present invention is not limited thereto or thereby.

The pixel layer 200 may further include a pixel definition layer PDL on the protective layer 230. The pixel definition layer PDL overlaps a boundary between the pixel areas PX shown in FIG. 1 when viewed in a plan view.

The organic layer OL includes an organic light emitting layer containing a low molecular weight or containing a high molecular weight organic material. The organic light emitting layer emits the light. The organic layer OL may selectively include a hole transport layer, a hole injection layer, an electron transport layer, and an electron injection layer in addition to the organic light emitting layer.

The second electrode CE is on the organic layer OL. the second electrode CE may be a common electrode or a negative electrode. The second electrode CE may be a transmissive electrode, a transflective electrode, or a reflective electrode. When the second electrode CE is the transmissive electrode, the second electrode CE may include Li, Ca, LiF/Ca, LiF/Al, Al, Mg, BaF, Ba, Ag, a compound thereof, and/or a mixture thereof (e.g., a mixture of Ag and Mg).

When the second electrode CE is the transflective electrode or is the reflective electrode, the second electrode CE may include Ag, Li, Mg, Al, Pt, Pd, Au, Ni, Nd, Ir, Cr, Li, Ca, LiF/Ca, LiF/Al, Mo, Ti, a compound thereof, and/or a mixture thereof (e.g., a mixture of Ag and Mg). The second electrode CE may have a multi-layer structure of a reflective layer or a transflective layer and a transparent conductive layer, which may be formed of indium tin oxide, indium zinc oxide, zinc oxide, indium tin zinc oxide, etc.

The second electrode CE includes an auxiliary electrode. The auxiliary electrode includes a layer formed by depositing the above-mentioned materials towards the light emitting layer, and also includes a transparent conductive oxide formed on the layer, such as indium tin oxide, indium zinc oxide, zinc oxide, indium tin zinc oxide, Mo, Ti, Ag, etc.

When the organic light emitting element LD is the front surface light emitting type, the first electrode AE is the reflective electrode, and the second electrode CE is the transmissive or transflective electrode. When the organic light emitting element LD is the rear surface light emitting type, the first electrode AE is the transmissive or transflective electrode, and the second electrode CE is the reflective electrode.

An inner space 320 that is defined by the pixel layer 200, the encapsulation substrate 300, and the sealing member 310 may be maintained in a vacuum state, although the present invention is not limited thereto or thereby. That is, the inner space 320 may instead be filled with nitrogen (N2) or with a filling member of an insulating material.

The organic light emitting display apparatus 1000 may further include a polarization plate (e.g., a polarizing film) 500. The polarization plate 500 faces the encapsulation substrate 300 or the substrate 100 such that the scattering layer 400 is therebetween. In the front surface light emitting type organic light emitting display apparatus 1000, the polarization plate 500 is on the scattering layer 400. The polarization layer 500 reduces or prevents an external light from being reflected. The polarization layer 500 has a film shape, although the present invention is not limited thereto or thereby.

In the front surface light emitting type organic light emitting display apparatus 1000, the scattering layer 400 is on the encapsulation substrate 300. The scattering layer 400 faces the substrate 100 such that the encapsulation substrate 300 is between the scattering layer 400 and the substrate 100. The scattering layer 400 is attached between the encapsulation substrate 300 and the polarization plate 500. The scattering layer 400 includes a plurality of scattering particles 410, and includes a resin 420. The resin 420 includes a transparent adhesive material to surround the scattering particles 410.

An optical path difference occurs in the light emitted from the organic light emitting display apparatus 1000 according to a viewing angle. When the organic light emitting display apparatus 1000 does not include the scattering layer 400, a difference in color occurs between the image that is displayed in the organic light emitting display apparatus 1000 and the image that is perceived by a user.

The scattering particles 410 included in the scattering layer 400 scatters the light incident thereto to reduce the color difference caused by the viewing angle. However, to obtain the effects of reduction of the color difference, various conditions, such as a concentration of the scattering particles 410, a material of the scattering particles 410, a particle size of the scattering particles 410, a concentration according to the particle size, a thickness of the scattering layer 400, etc., may be variously determined.

The scattering particles 410 may have various particle sizes in a range (e.g., a specific range). The concentration of the scattering particles 410 having a largest size in the range (e.g., the size of the group of the scattering particles 410 having the largest number, when the scattering particles 410 are grouped according to size, or the similarly sized ones of the scattering particles 410 having a highest concentration of the scattering particles 410), may be referred to as a first particle size (e.g., a mode particle size, or a particle size of a most commonly occurring similarly sized scattering particles 410), and the concentration of the scattering particles 410 decreases as a difference in particle size between the scattering particles 410 having the first particle size and other scattering particles 410 increases. That is, a concentration of the scattering particles 410 not of the first size is inversely proportional to a magnitude of a difference in particle size between those scattering particles 410 and the scattering particles 410 having the first particle size The concentration of the scattering particles 410 having a specific particle size is inversely proportional to the difference between the specific particle size and the first particle size. That is, as the difference between the specific particle size and the first particle size increases, the concentration of the scattering particles having the specific particle size decreases.

The concentration of the scattering particles 410 according to the particle size of the scattering particles 410 satisfies a normal distribution. The concentration of the scattering particles 410 may be about 50% or less in the scattering layer 400 (e.g., the scattering particles 410 may comprises about 50% or less of the total material of the scattering layer 400 including the scattering particles 410 and the resin 420).

The thickness of the scattering layer 400 may be about 50 micrometers or less. When the thickness of the scattering layer 400 is greater than about 50 micrometers, a transmittance of the scattering layer 400 may be reduced, and a reflectance and a refractive index may be suboptimal.

The scattering particles 410 may include at least one of $Al_2O_3$, Zr, and $SiO_2$.

Figure 5:
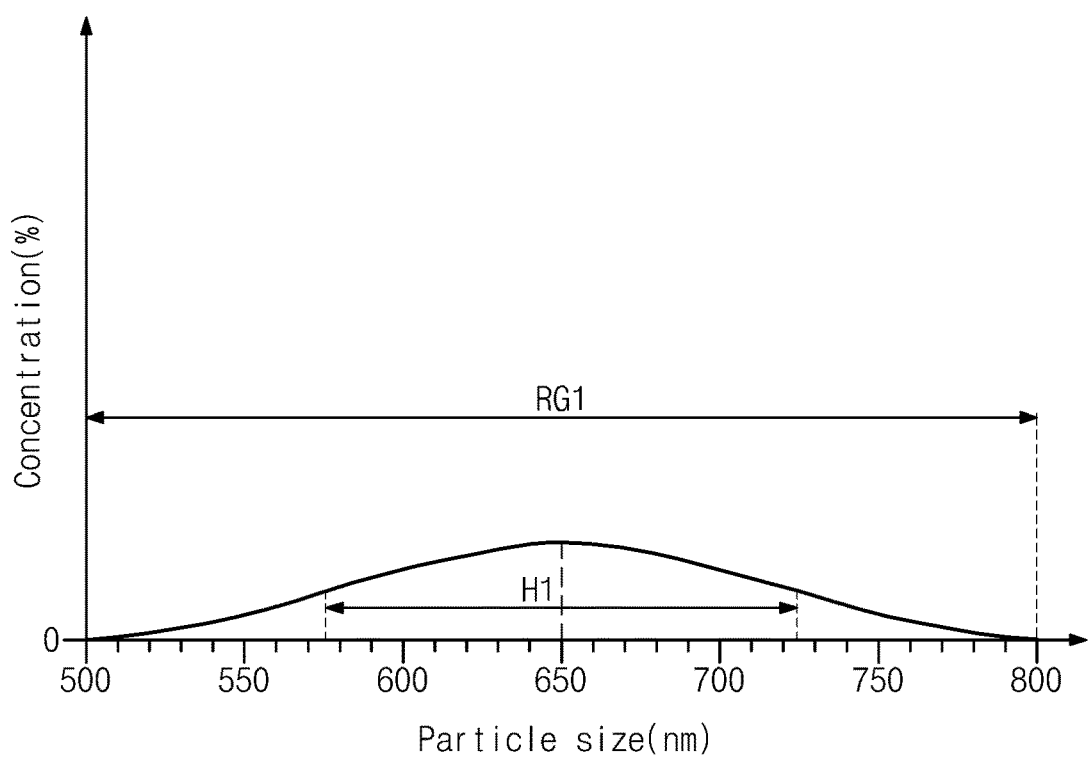
FIGS. 5 to 8 are graphs showing a concentration percentage as a function of a particle size of scattering particles in first to fourth exemplary embodiments.

FIG. 5 is a graph showing the concentration as a function of the particle size of the scattering particles in a first exemplary embodiment.

Referring to FIGS. 3 to 5, the scattering particles 410 may have various particle sizes in a first range RG1. The first range RG1 may be from about 500 nm to about 800 nm. In the first exemplary embodiment, the first particle size is about 650 nm. In the first exemplary embodiment, a full-width half-maximum H1 of the concentration graph according to the particle size of the scattering particles 410 is in a range from about 145 nm to about 155 nm (e.g., particle sizes ranging from about 575 nm to about 725 nm).

Figure 6:
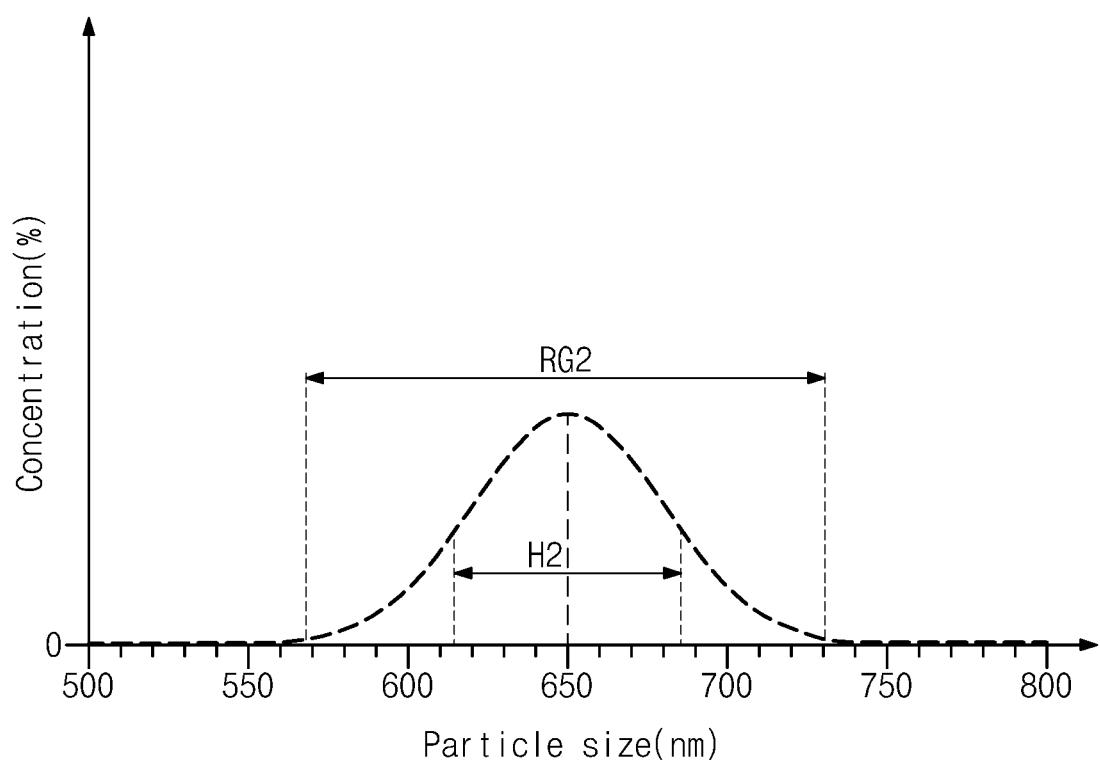

FIG. 6 is a graph showing the concentration as a function of the particle size of the scattering particles in a second exemplary embodiment.

Referring to FIGS. 3, 4, and 6, the scattering particles 410 may have various particle sizes in a second range RG2. The second range RG2 is included in the first range RG1 shown in FIG. 5. The second range RG2 is from about 560 nm to about 740 nm. In the second exemplary embodiment, the first particle size is about 650 nm. In the second exemplary embodiment, a full-width half-maximum H2 of the concentration graph according to the particle size of the scattering particles 410 is in a range from about 70 nm to about 80 nm (e.g., particle sizes ranging from about 610 nm to about 690 nm).

Figure 7:
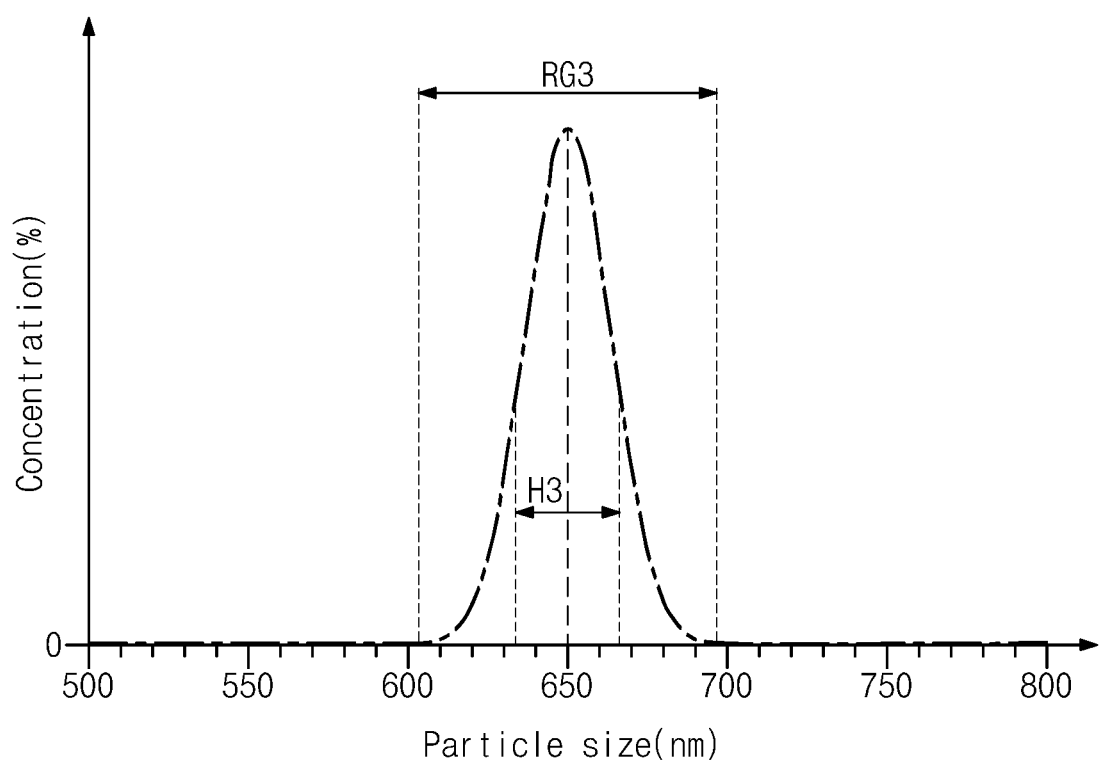

FIG. 7 is a graph showing the concentration as a function of the particle size of the scattering particles in a third exemplary embodiment.

Referring to FIGS. 3, 4, and 7, the scattering particles 410 may have various particle sizes in a third range RG3. The third range RG3 is within the first range RG1 shown in FIG. 5. The third range RG3 is from about 605 nm to about 695 nm. In the third exemplary embodiment, the first particle size is about 650 nm. In the third exemplary embodiment, a full-width half-maximum H3 of the concentration graph according to the particle size of the scattering particles 410 is in a range from about 25 nm to about 35 nm (e.g., particle sizes ranging from about 635 nm to about 665 nm).

Figure 8:
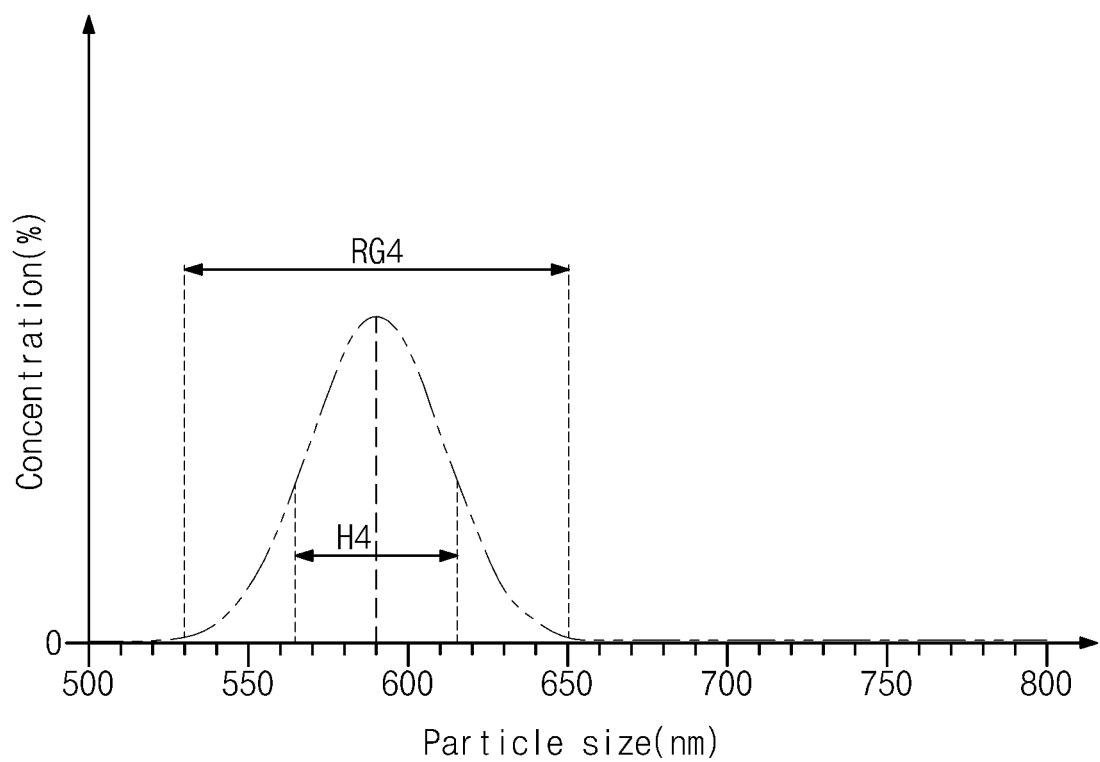

FIG. 8 is a graph showing the concentration as a function of the particle size of the scattering particles in a fourth exemplary embodiment.

Referring to FIGS. 3, 4, and 8, the scattering particles 410 may have various particle sizes in a fourth range RG4. The fourth range RG4 is from about 515 nm to about 665 nm. In the fourth exemplary embodiment, the first particle size is about 590 nm. In the fourth exemplary embodiment, a full-width half-maximum H4 of the concentration graph according to the particle size of the scattering particles 410 is in a range from about 45 nm to about 55 nm (e.g., particle sizes ranging from about 565 nm to about 615 nm).

FIGS. 9 to 13 are graphs showing a variation in an x-axis coordinate, or a y-axis coordinate, of red, green, blue, and white colors as a function of a viewing angle in a CIE 1931 chromaticity diagram.

Figure 9:
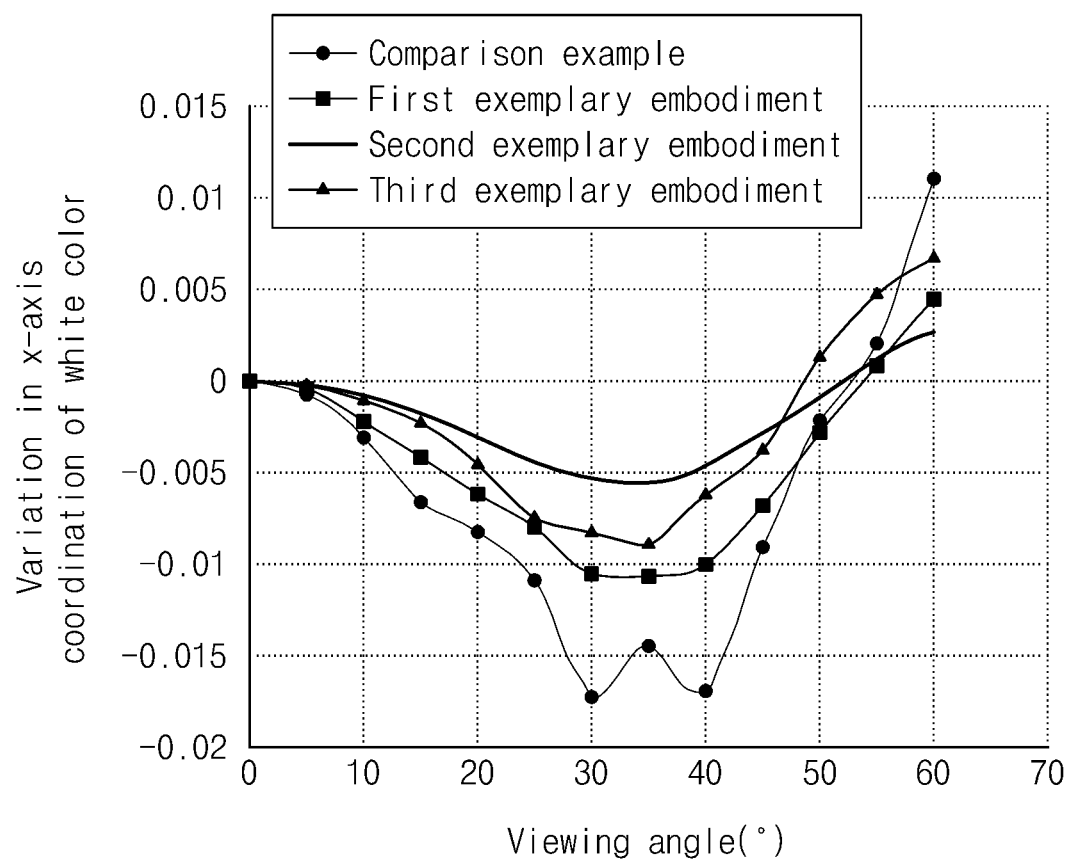
FIGS. 9 to 13 are graphs showing a variation in an x-axis coordinate, or a y-axis coordinate, of red, green, blue, and white colors as a function of a viewing angle in a CIE 1931 chromaticity diagram.
Figure 10:
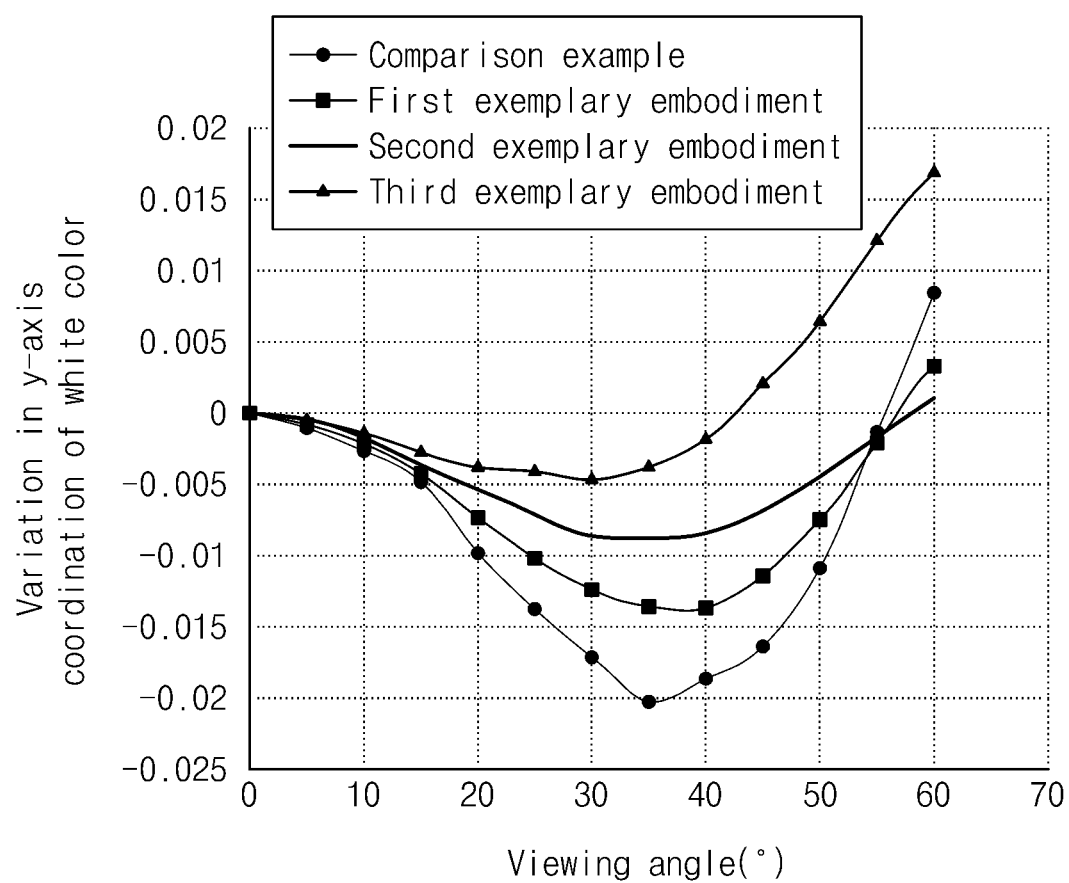

In FIGS. 9 to 13, a comparison example indicates an organic light emitting display apparatus having no scattering layer 400. In FIGS. 9 to 13, a first exemplary embodiment includes the scattering layer 400 having the concentration graph of the scattering particles 410 shown in FIG. 5, a second exemplary embodiment includes the scattering layer 400 having the concentration graph of the scattering particles 410 shown in FIG. 6, and a third exemplary embodiment includes the scattering layer 400 having the concentration graph of the scattering particles 410 shown in FIG. 7, FIG. 9 is a graph showing the variation in the x-axis coordinate of the white color as a function of the viewing angle, and FIG. 10 is a graph showing the variation in the y-axis coordinate of the white color as a function of the viewing angle.

Referring to FIG. 9, in the first to third exemplary embodiments, the variation in the x-axis coordinate of the white color according to the viewing angle is smaller than that of the comparison example. In other words, a width of the variation in the x-axis coordinate of the white color of the first to third exemplary embodiments is smaller than that of the comparison example.

Referring to FIG. 10, in the first to third exemplary embodiments, the variation in the y-axis coordinate of the white color according to the viewing angle is smaller than that of the comparison example. In other words, a width of the variation in the y-axis coordinate of the white color of the first to third exemplary embodiments is smaller than that of the comparison example.

Accordingly, the color difference of the white color according to the viewing angle of the first to third exemplary embodiments is smaller than that of the comparison example.

Figure 11:
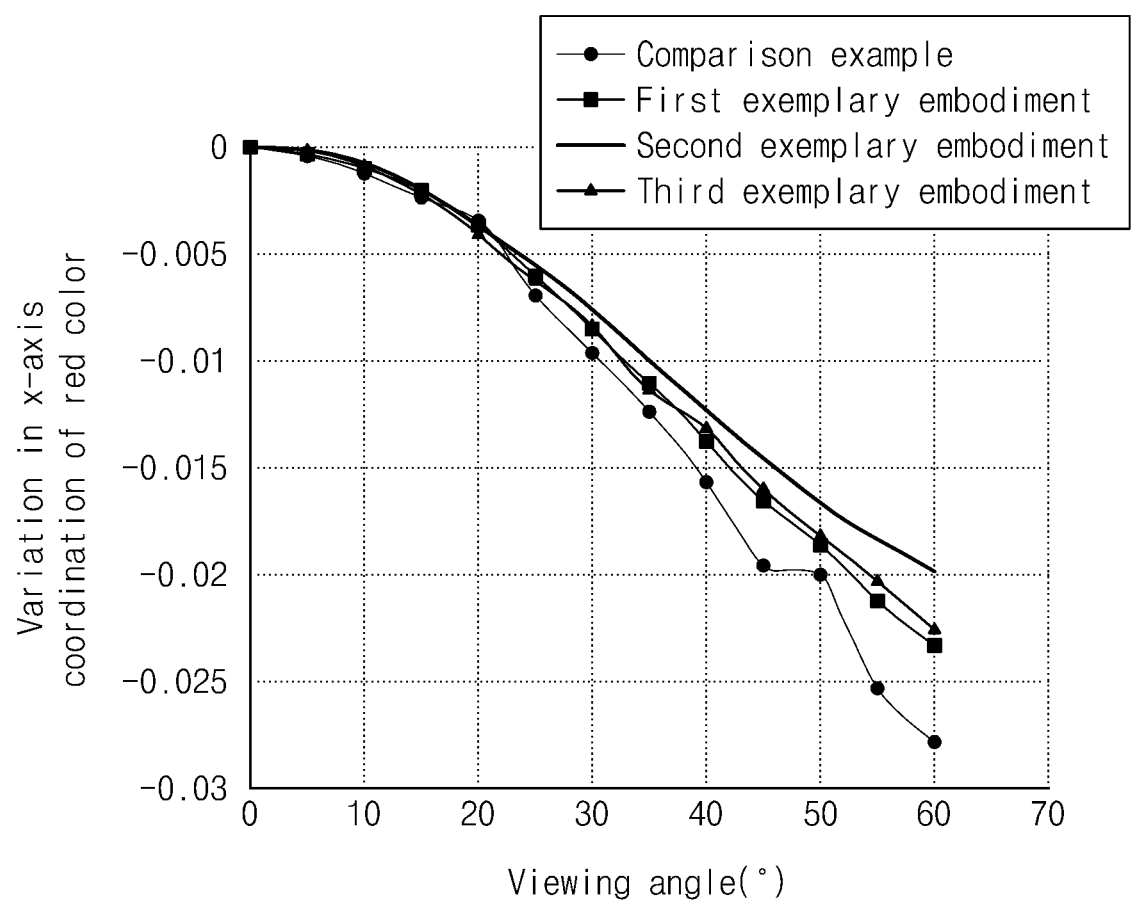

FIG. 11 is a graph showing the variation in the x-axis coordinate of the red color as a function of the viewing angle. In case of the red color, the variation in the x-axis coordinate is a more significant factor (e.g., has a bigger impact on display quality) than the variation in the y-axis coordinate. Therefore, description of the variation in the y-axis coordinate of the red color will be omitted.

Referring to FIG. 11, in the first to third exemplary embodiments, the variation in the x-axis coordinate of the red color according to the viewing angle is smaller than that of the comparison example. In other words, a width of the variation in the x-axis coordinate of the red color of the first to third exemplary embodiments is smaller than that of the comparison example.

Accordingly, the color difference of the red color according to the viewing angle of the first to third exemplary embodiments is smaller than that of the comparison example.

Figure 12:
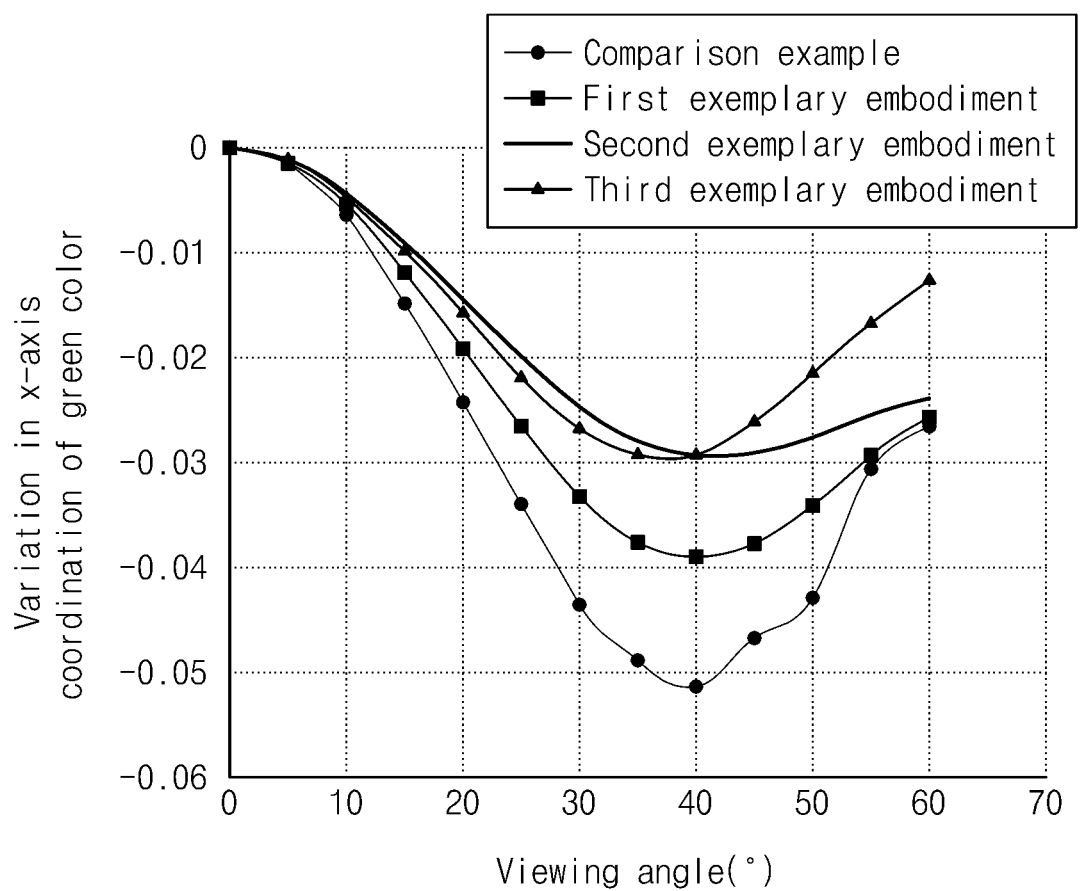

FIG. 12 is a graph showing the variation in the x-axis coordinate of the green color as a function of the viewing angle. In case of the green color, the variation in the x-axis coordinate is a more significant factor than the variation in the y-axis coordinate. Therefore, description of the variation in the y-axis coordinate of the green color will be omitted.

Referring to FIG. 12, in the first to third exemplary embodiments, the variation in the x-axis coordinate of the green color according to the viewing angle is smaller than that of the comparison example. In other words, a width of the variation in the x-axis coordinate of the green color of the first to third exemplary embodiments is smaller than that of the comparison example.

Accordingly, the color difference of the green color according to the viewing angle of the first to third exemplary embodiments is smaller than that of the comparison example.

Figure 13:
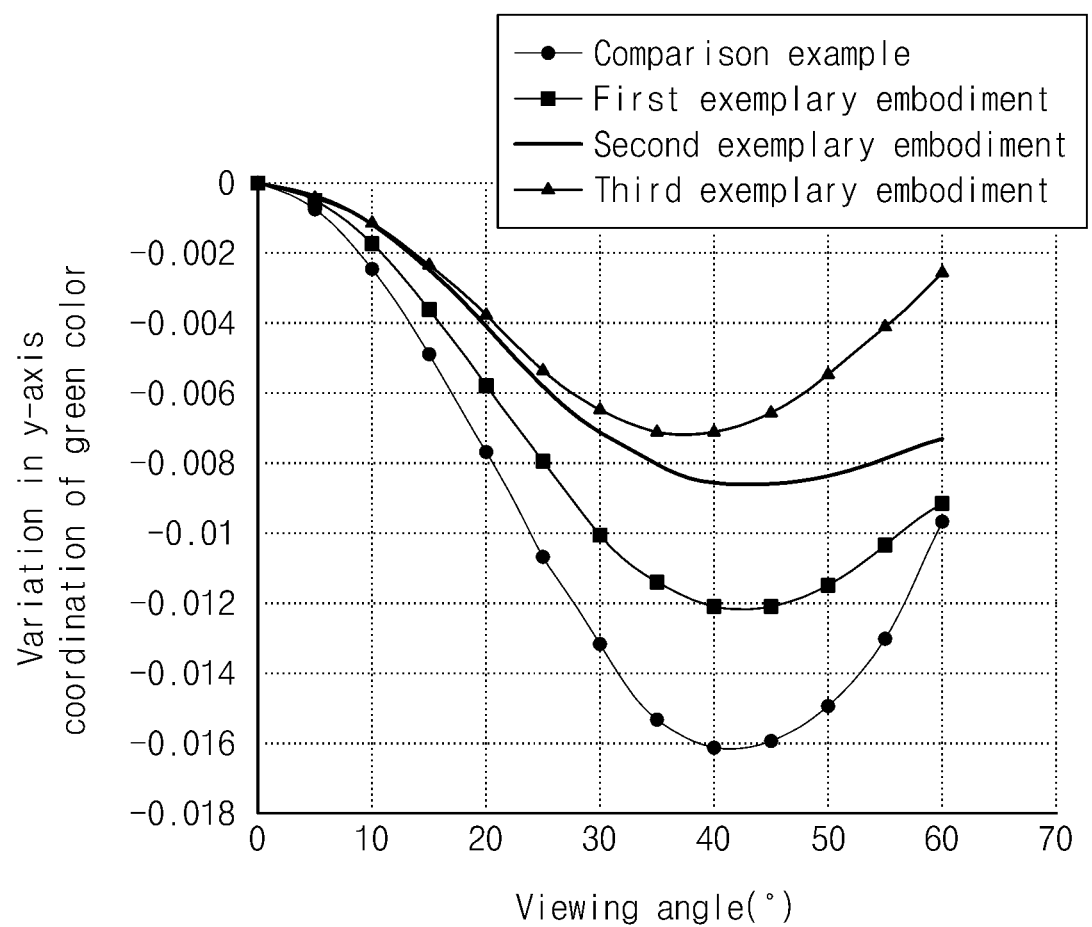

FIG. 13 is a graph showing the variation in the y-axis coordinate of the blue color as a function of the viewing angle. In case of the blue color, unlike the red color and the green color, the variation in the y-axis coordinate is more significant to display quality than the variation in the x-axis coordinate. Therefore, description of the variation in the x-axis coordinate of the blue color will be omitted.

Referring to FIG. 13, in the first to third exemplary embodiments, the variation in the y-axis coordinate of the blue color according to the viewing angle is smaller than that of the comparison example. In other words, a width of the variation in the y-axis coordinate of the blue color of the first to third exemplary embodiments is smaller than that of the comparison example.

Accordingly, the color difference of the blue color according to the viewing angle of the first to third exemplary embodiments is smaller than that of the comparison example.

Figure 14:
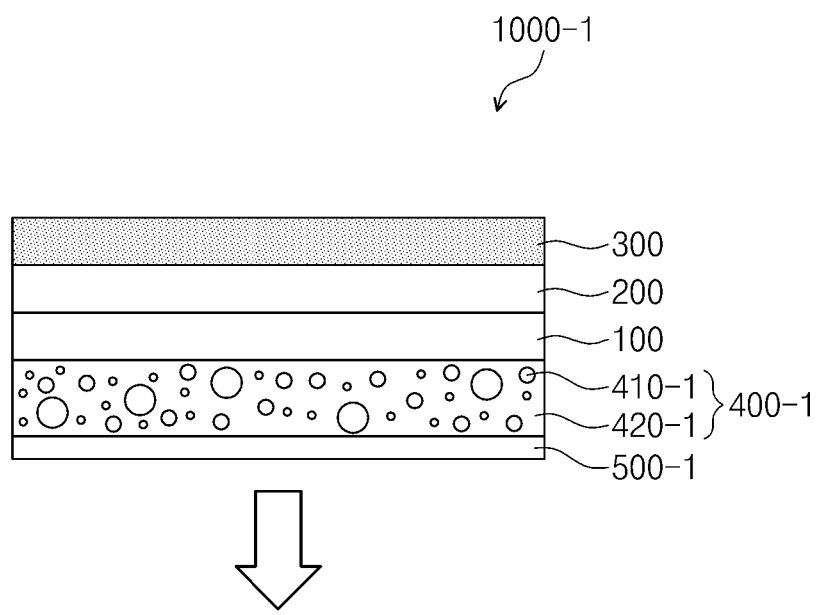
FIG. 14 is a cross-sectional view showing a structure of a rear surface light emitting type organic light emitting display apparatus.

FIG. 14 is a cross-sectional view showing a structure of a rear surface light emitting type organic light emitting display apparatus 1000-1.

Referring to FIG. 14, the organic light emitting display apparatus 1000-1 includes a substrate 100, a pixel layer 200, an encapsulation substrate 300, a scattering layer 400-1, and a polarization plate 500-1.

The substrate 100, the pixel layer 200, and the encapsulation substrate 300 of the organic light emitting display apparatus 1000-1 have the same structure and function as those of the organic light emitting display apparatus 1000 described with reference to FIGS. 2 to 4, and thus details thereof will be omitted.

In the present embodiment, the scattering layer 400-1 is under the substrate 100 in the rear surface light emitting type organic light emitting display apparatus 1000-1. The scattering layer 400-1 faces the encapsulation substrate 300 such that the substrate 100 is between the scattering layer 400-1 and the encapsulation substrate 300. The scattering layer 400-1 is attached between the encapsulation substrate 300 and the polarization plate 500-1. The scattering layer 400-1 includes a plurality of scattering particles 410-1 and a resin 420-1. The scattering particles 410-1 and the resin 420-1 have the same structure and function as those of the organic light emitting display apparatus 1000 described with reference to FIGS. 2 to 4, and thus repeated details thereof will be omitted.

The polarization plate 500-1 is under the scattering layer 400-1 in the rear surface light emitting type organic light emitting display apparatus 1000-1. The polarization plate 500-1 faces the substrate 100 to allow the scattering layer 400-1 to be between the polarization plate 500-1 and the substrate 100. The polarization plate 500-1 reduces or prevents light reflection from occurring due to an external light.

The polarization plate 500-1 has a film shape, but it should not be limited thereto or thereby.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed by the claims and their equivalents.

What is claimed is:

1. An organic light emitting display apparatus comprising:
    a substrate;
    a plurality of organic light emitting elements on the substrate;
    an encapsulation layer covering the organic light emitting elements; and
    a scattering layer on the encapsulation layer, and separated from the plurality of organic light emitting elements, the scattering layer comprising:
        a resin; and
        a plurality of scattering particles distributed in the resin, and comprising a variety of particle sizes,
    wherein concentrations of respective groups of similarly sized ones of the scattering particles satisfy a normal distribution,
    wherein ones of the scattering particles having a first particle size comprise a highest concentration of the scattering particles, and
    wherein a concentration of other ones of the scattering particles is inversely proportional to a magnitude of a difference in particle size between the other ones of the scattering particles and the ones of the scattering particles having the first particle size.

2. The organic light emitting display apparatus of claim 1, wherein the scattering layer faces the substrate such that the encapsulation layer is between the scattering layer and the substrate.

3. The organic light emitting display apparatus of claim 1, further comprising
    a polarizing film on the scattering layer.

4. The organic light emitting display apparatus of claim 3, wherein the resin comprises a transparent adhesive material, and
    wherein the scattering layer is attached to the polarizing film.

5. The organic light emitting display apparatus of claim 3, wherein the scattering layer has a thickness of about 50 micrometers or less.

6. The organic light emitting display apparatus of claim 3, wherein a concentration of the scattering particles with respect to the scattering layer is about 50% or less.

7. The organic light emitting display apparatus of claim 3, wherein the scattering particles comprise at least one of $Al_2O_3$, $Zr$ or $SiO_2$.

8. The organic light emitting display apparatus of claim 1, wherein the plurality of scattering particles has a variety of particle sizes in a first range from about 500 nm to about 800 nm.

9. The organic light emitting display apparatus of claim 8, wherein the first particle size is about 650 nm, and
    wherein a full-width half-maximum corresponding to a graph of concentration percentages of the scattering particles grouped by particle size as a function of the particle size is in a range from about 145 nm to about 155 nm.

10. The organic light emitting display apparatus of claim 8, wherein the scattering particles have a variety of particle sizes in a second range from about 560 nm to about 740 nm,
    wherein the first particle size is about 650 nm, and
    wherein a full-width half-maximum corresponding to a graph of concentration percentages of the scattering particles grouped by particle size as a function of the particle size is in a range from about 70 nm to about 80 nm.

11. The organic light emitting display apparatus of claim 8, wherein the scattering particles have a variety of particle sizes in a third range from about 605 nm to about 695 nm,
    wherein the first particle size is about 650 nm, and
    wherein a full-width half-maximum corresponding to a graph of concentration percentages of the scattering particles grouped by particle size as a function of the particle size is in a range from about 25 nm to about 35 nm.

12. The organic light emitting display apparatus of claim 8, wherein the scattering particles have a variety of particle sizes in a fourth range from about 515 nm to about 665 nm,
    wherein the first particle size is about 590 nm, and
    wherein a full-width half-maximum corresponding to a graph of concentration percentages of the scattering particles grouped by particle size as a function of the particle size is in a range from about 45 nm to about 55 nm.

13. An organic light emitting display apparatus comprising:
    a substrate;
    a plurality of organic light emitting elements on the substrate;
    an encapsulation layer covering the organic light emitting elements;
    a scattering layer below the encapsulation layer, and separated from the plurality of organic light emitting elements, the scattering layer comprising:
        a resin; and
        a plurality of scattering particles distributed in the resin, and comprising a variety of particle sizes,
    wherein the scattering layer faces the encapsulation layer such that the substrate is between the scattering layer and the encapsulation layer,
    wherein ones of the scattering particles having a first particle size comprise a highest concentration of the scattering particles, and
    wherein a concentration of other ones of the scattering particles is inversely proportional to a magnitude of a difference in particle size between the other ones of the scattering particles and the ones of the scattering particles having the first particle size.

14. The organic light emitting display apparatus of claim 13, further comprising a polarizing film below the scattering layer,
    wherein the plurality of scattering particles has a variety of particle sizes in a first range from about 500 nm to about 800 nm.

15. An organic light emitting display apparatus comprising:
    a substrate;
    a plurality of organic light emitting elements on the substrate;
    an encapsulation layer covering the organic light emitting elements;
    a scattering layer on the encapsulation layer, and separated from the plurality of organic light emitting elements, the scattering layer comprising:

a resin; and a plurality of scattering particles distributed in the resin; and a polarizing film on the scattering layer, wherein the scattering particles have a variety of particle sizes, wherein ones of the scattering particles having a first particle size comprise a highest concentration of the scattering particles, and wherein a concentration of other ones of the scattering particles is inversely proportional to a magnitude of a difference in particle size between the other ones of the scattering particles and the ones of the scattering particles having the first particle size.

16. The organic light emitting display apparatus of claim 15, wherein the plurality of scattering particles has a variety of particle sizes in a first range from about 500 nm to about 800 nm, and wherein the scattering layer has a thickness of about 50 micrometers or less.

17. The organic light emitting display apparatus of claim 15, wherein concentrations of respective ones of the scattering particles grouped according to a particle size satisfy a normal distribution.

18. The organic light emitting display apparatus of claim 15, wherein a concentration of the scattering particles with respect to the scattering layer is about 50% or less.

* * * * *